US007545012B2

(12) United States Patent
Smith et al.

(10) Patent No.: US 7,545,012 B2
(45) Date of Patent: Jun. 9, 2009

(54) CAPACITIVE MICROMACHINED ULTRASOUND TRANSDUCER FABRICATED WITH EPITAXIAL SILICON MEMBRANE

(75) Inventors: Lowell Scott Smith, Niskayuna, NY (US); David Martin Mills, Niskayuna, NY (US); Jeffrey Bernard Fortin, Niskayuna, NY (US); Wei-Cheng Tian, Clifton Park, NY (US); John Robert Logan, Danville, CA (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 11/393,317

(22) Filed: Mar. 30, 2006

(65) Prior Publication Data

US 2006/0170014 A1 Aug. 3, 2006

Related U.S. Application Data

(62) Division of application No. 11/023,252, filed on Dec. 27, 2004, now Pat. No. 7,037,746.

(51) Int. Cl.
*H01L 29/82* (2006.01)
*H01L 41/02* (2006.01)
*H04R 17/00* (2006.01)

(52) U.S. Cl. ....................... 257/416; 367/163; 367/181; 310/324; 73/718

(58) Field of Classification Search ................. 257/414, 257/416; 367/163, 181; 73/718, 724; 310/324
See application file for complete search history.

(56) References Cited

U.S. PATENT DOCUMENTS 4,838,088 A * 6/1989 Murakami ................... 73/724
4,879,903 A 11/1989 Ramsey et al.
4,882,933 A 11/1989 Petersen et al.
4,904,978 A 2/1990 Barth et al.
5,060,526 A 10/1991 Barth et al.
5,062,302 A 11/1991 Petersen et al.
5,231,301 A 7/1993 Peterson et al.
5,355,712 A 10/1994 Petersen et al.
5,461,922 A 10/1995 Koen (Continued)

FOREIGN PATENT DOCUMENTS

DE 19914728 B4 10/2004

(Continued)

OTHER PUBLICATIONS

Yongli Huang, S. Sanli Ergun, Haeggstrom, Mohammed H. Badi, and B.T. Khuri-Yakub; Fabricating Capacitive Micormachined Ultrasonic Transducers with Wafer-Bonding Technology, Apr. 2003.

*Primary Examiner*—M. Wilczewski
(74) *Attorney, Agent, or Firm*—Fletcher Yoder

(57) ABSTRACT

A capacitive micromachined ultrasound transducer (cMUT) cell is presented. The cMUT cell includes a lower electrode. Furthermore, the cMUT cell includes a diaphragm disposed adjacent to the lower electrode such that a gap having a first gap width is formed between the diaphragm and the lower electrode, wherein the diaphragm comprises one of a first epitaxial layer or a first polysilicon layer. In addition, a stress reducing material is disposed in the first epitaxial layer.

21 Claims, 4 Drawing Sheets

U.S. PATENT DOCUMENTS

| | | | | | |
|---|---|---|---|---|---|
| 5,912,499 | A | * | 6/1999 | Diem et al. | 257/419 |
| 6,012,335 | A | * | 1/2000 | Bashir et al. | 73/724 |
| 6,038,928 | A | | 3/2000 | Maluf et al. | |
| 6,084,257 | A | | 7/2000 | Petersen et al. | |
| 6,140,143 | A | | 10/2000 | Christel et al. | |
| 6,316,796 | B1 | | 11/2001 | Petersen et al. | |
| 6,465,271 | B1 | | 10/2002 | Ko et al. | |
| 6,639,339 | B1 | * | 10/2003 | Bernstein | 310/311 |
| 6,649,989 | B2 | * | 11/2003 | Benzel et al. | 257/419 |
| 6,847,090 | B2 | | 1/2005 | Loeppert et al. | |
| 7,045,459 | B2 | * | 5/2006 | Freidhoff | 438/666 |
| 2002/0025595 | A1 | * | 2/2002 | Xu et al. | 438/48 |
| 2004/0085858 | A1 | | 5/2004 | Khuri-Yakub et al. | |

FOREIGN PATENT DOCUMENTS

EP 0747686 A1 4/1999

* cited by examiner

CAPACITIVE MICROMACHINED ULTRASOUND TRANSDUCER FABRICATED WITH EPITAXIAL SILICON MEMBRANE

CROSS-REFERENCE TO RELATED APPLICATION

This application is a divisional of U.S. application Ser. No. 11/023,252, filed Dec. 27, 2004 now U.S. Pat. No. 7,037,746.

BACKGROUND

The invention relates generally to electrostatic sensors, and more specifically to capacitive micromachined ultrasound transducers (cMUTs).

Transducers are devices that transform input signals of one form into output signals of a different form. Commonly used transducers include, heat sensors, pressure sensors, light sensors, and acoustic sensors. An example of an acoustic sensor is an ultrasonic transducer, which may be implemented in medical imaging, non-destructive evaluation, and other applications.

One form of an ultrasonic transducer is a capacitive micromachined ultrasound transducer (cMUT). A cMUT cell generally includes a substrate that contains a lower electrode, a diaphragm suspended over the substrate by means of support posts, and a metallization layer that serves as an upper electrode. The lower electrode, diaphragm, and the upper electrode define a cavity. As will be appreciated by one skilled in the art, the support posts typically engage the edges of the diaphragm to form a cMUT cell. Further, a voltage applied between the lower electrode and the upper electrode causes the diaphragm to vibrate and emit sound, or in the alternative, received sound waves cause the diaphragm to vibrate and provide a change in capacitance. The diaphragm may be sealed to provide operation of the cMUT cells immersed in liquids.

As described above, a cMUT cell generally includes a diaphragm disposed over a vacuum cavity and the cavities in the cMUTs have been selectively etched through openings in the diaphragm to form the underlying cavity. Traditionally, these cMUTs are fabricated employing surface micromachining techniques. However, as will be appreciated, cMUTs fabricated employing surface micromachining techniques suffer from low yield and non-uniformities in the diaphragm. Alternatively, a silicon-on-insulator (SOI) wafer may be bonded to a silicon substrate that has cavities lithographically produced in an oxide cover layer. These bulk-micromachined cMUTs provide better predictability, reproducibility and uniformity of the diaphragms compared to the surface-micromachined cMUTs. However, use of the SOI wafers may not be cost effective. Furthermore, the process flexibility is limited by using SOI wafers and it is difficult to generate complex diaphragm structures using the conventional cMUT fabrication technology known in the art.

Therefore, in order to ensure predictability, reproducibility and uniformity of the diaphragms with low cost, high availability, and flexible design, it may be desirable to develop techniques that alleviate the problems associated with the current fabrication techniques employed to fabricate cMUT diaphragms.

BRIEF DESCRIPTION

Briefly in accordance with one embodiment of the present technique, a capacitive micromachined ultrasound transducer (cMUT) cell is presented. The cMUT cell includes a lower electrode. Furthermore, the cMUT cell includes a diaphragm disposed adjacent to the lower electrode such that a gap having a first gap width is formed between the diaphragm and the lower electrode, wherein the diaphragm comprises one of a first epitaxial layer or a first polysilicon layer. In addition, a stress reducing material is disposed in one of the first epitaxial layer or the first polysilicon layer.

In accordance with aspects of the present technique, a method for fabricating a cMUT cell is presented. The method includes forming a cavity on a topside of a first substrate, wherein the cavity is defined by a plurality of support posts. Further, the method includes disposing a diaphragm on the plurality of support posts to form a composite structure having a gap between the lower electrode and the diaphragm, wherein the diaphragm comprises one of a first epitaxial layer or a first polysilicon layer. In addition, the method includes disposing a stress reducing material in one of the first epitaxial layer or the first polysilicon layer.

In accordance with yet another aspect of the present technique, a method for fabricating a cMUT cell is presented. The method includes disposing one of a first epitaxial layer or a first polysilicon layer on a first substrate, wherein one of the first epitaxial layer or the first polysilicon layer and the first substrate are oppositely doped, and wherein a level of doping in one of the first epitaxial layer or the first polysilicon layer is different than a level of doping in the first substrate. Also, the method includes disposing a stress reducing material in one of the first epitaxial layer or the first polysilicon layer.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

In many fields, such as medical imaging and non-destructive evaluation, it may be desirable to utilize ultrasound transducers that enable the generation of high quality diagnostic images. High quality diagnostic images may be achieved by means of ultrasound transducers, such as, capacitive micromachined ultrasound transducers (cMUTs), that exhibit reduced parasitic capacitances thereby leading to high sensitivity. Furthermore, it may also be desirable to develop a cost-effective method of fabrication of ultrasound transducers, such as cMUTs, that ensure predictability, reproducibility and uniformity of a cMUT diaphragm. Additionally, it may be advantageous to enhance design flexibility of the cMUT diaphragms. The techniques discussed herein address some or all of these issues.

Figure 1:
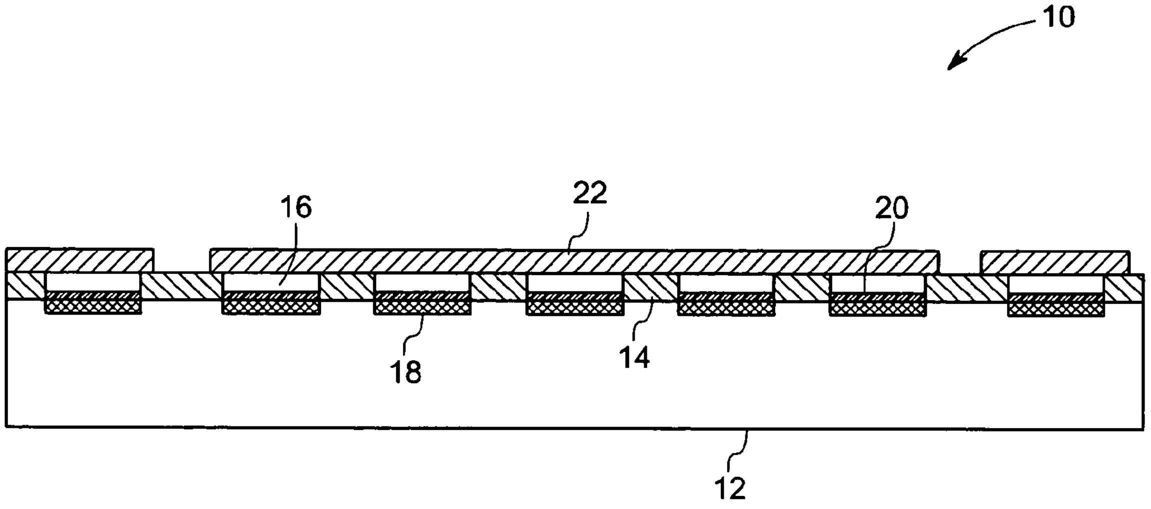
FIG. 1 is a cross-sectional side view illustrating an exemplary embodiment of a cMUT cell, where the diaphragm is configured to operate as an upper electrode and a substrate is locally doped and the doped region is configured to operate as a lower electrode, according to aspects of the present technique.

Turning now to FIG. 1, a side view of a cross-section of an exemplary embodiment of a capacitive micromachined ultrasound transducer (cMUT) cell 10 is illustrated. As will be appreciated by one skilled in the art, the figures are for illustrative purposes and are not drawn to scale. The cMUT cell 10 comprises a substrate 12 having a topside and a bottom side. The substrate 12 may include one of a glass, silicon or combinations thereof Further, the substrate 12 may include a p-type or an n-type silicon wafer. In addition, a level of doping in the substrate 12 may be low. For example, the level of doping in the substrate 12 may be approximately in a range from about $1e^{13}$ per $cm^3$ to about $1e^{20}$ per $cm^3$. Consequently, the substrate 12 may be configured to exhibit high resistivity. The thickness of the substrate 12 may be, for example, approximately in a range from about 50 μm to about 500 μm.

A plurality of support posts 14 having a topside and a bottom side may be disposed on the topside of the substrate 12. The support posts 14 may be configured to define a cavity 16. Generally, the height of the support posts 14 is in a range from about 0.1 μm to about 10.0 μm. Also, the support posts 14 may be formed using dielectric material, such as, but not limited to, silicon dioxide or silicon nitride. Additionally, the cavity 16 may have a depth in a range from about 0.05 μm to about 10.0 μm.

A lower electrode 18 may be disposed on the substrate 12 within the cavity 16. In accordance with aspects of the present technique, the lower electrode 18 may be implanted in the substrate 12. Further, the lower electrode 18 may include a p-type or an n-type material. Alternatively, the lower electrode 18 may be diffused in the substrate 12. The thickness of the lower electrode 18 may be, for example, approximately in a range from about 0.05 μm to about 9.95 μm. In addition, the lower electrode 18 may be highly doped and thereby may be configured to exhibit low resistivity. For example, the level of doping in the lower electrode 18 may be approximately in a range from about $1e^{17}$ per $cm^3$ to about $1e^{20}$per $cm^3$. Moreover, the cavity 16 may include a dielectric floor 20 that is configured to provide electrical isolation between the lower electrode 18 and an upper electrode.

With continuing reference to FIG. 1, a membrane or diaphragm 22 may be disposed on the topside of the plurality of support posts 14. The diaphragm 22 may include an epitaxial layer of silicon. Moreover, the diaphragm may include p-type or n-type material. The diaphragm may be highly doped and thereby may be configured to exhibit low resistivity. For example, the level of doping in the diaphragm 22 may be approximately in a range from about $1e^{13}$ per $cm^3$ to about $1e^{20}$ per $cm^3$. Further, in accordance with aspects of the present technique, a stress reducing material may be disposed in the epitaxial layer of silicon. For example, the stress reducing material may include germanium. In an alternate embodiment, the diaphragm 22 may include a polysilicon layer.

As will be appreciated, highly doped epitaxial layers exhibit a high level of intrinsic stress due to high doping levels. In a condition where the highly doped epitaxial layer is employed as a diaphragm in a cMUT, the epitaxial layer may experience compressive and/or tensile stress. Consequently, the mechanical properties of the epitaxial layer are affected, and therefore the response of the cMUT device may be altered.

As a solution to the abovementioned problem, the stress experienced by the epitaxial layer may be substantially lowered via doping the epitaxial layer. In one embodiment, germanium (Ge) may be disposed in the epitaxial layer, where germanium may be employed as the stress reducing material. The stress reducing material may be disposed in the epitaxial layer employing state of the art techniques during silicon boule manufacturing. Alternatively, the stress reducing material may be disposed in the epitaxial layer via ion implantation after the silicon has been cut from the boule and made into wafer form.

In accordance with an aspect of the present technique, the diaphragm 22 may be fabricated employing a single crystal silicon. Alternatively, materials, such as, but not limited to, silicon nitride, silicon oxide, polycrystalline silicon, or other semiconductor materials may also be employed to fabricate the diaphragm 22. Furthermore, the thickness of the epitaxial layer of silicon is based upon a pre-determined thickness of the diaphragm 22. For example, the thickness of the diaphragm 22 may typically be in a range from about 0.1 μm to about 20 μm. Additionally, in the illustrated embodiment, the diaphragm 22 may be configured for use as an upper electrode of the cMUT cell 10.

Figure 2:
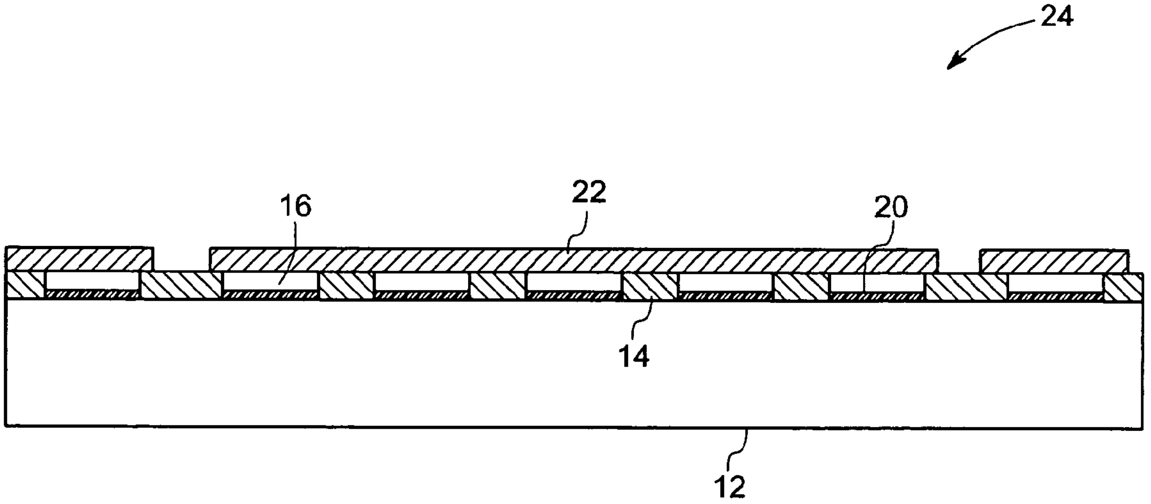
FIG. 2 is a cross-sectional side view illustrating an exemplary embodiment of the cMUT cell of FIG. 1, where the diaphragm is configured to operate as an upper electrode and a substrate is configured to operate as a lower electrode, according to aspects of the present technique.

Referring now to FIG. 2, a side view of a cross-section of an alternate embodiment 24 of the cMUT cell 10 of FIG. 1 is illustrated. In accordance with aspects of the present technique, the substrate 12 may be highly doped. Consequently, the substrate 12 may be configured to exhibit low resistivity. In the illustrated embodiment of FIG. 2, the substrate 12 may be configured for use as the lower electrode. The diaphragm 22 may include an epitaxial layer of silicon. Further, in accordance with aspects of the present technique, the epitaxial layer of silicon may include a stress reducing material, such as, but not limited to, germanium, disposed therethrough. As previously mentioned, the diaphragm may include p-type or n-type material and may be configured to exhibit low resistivity.

Figure 3:
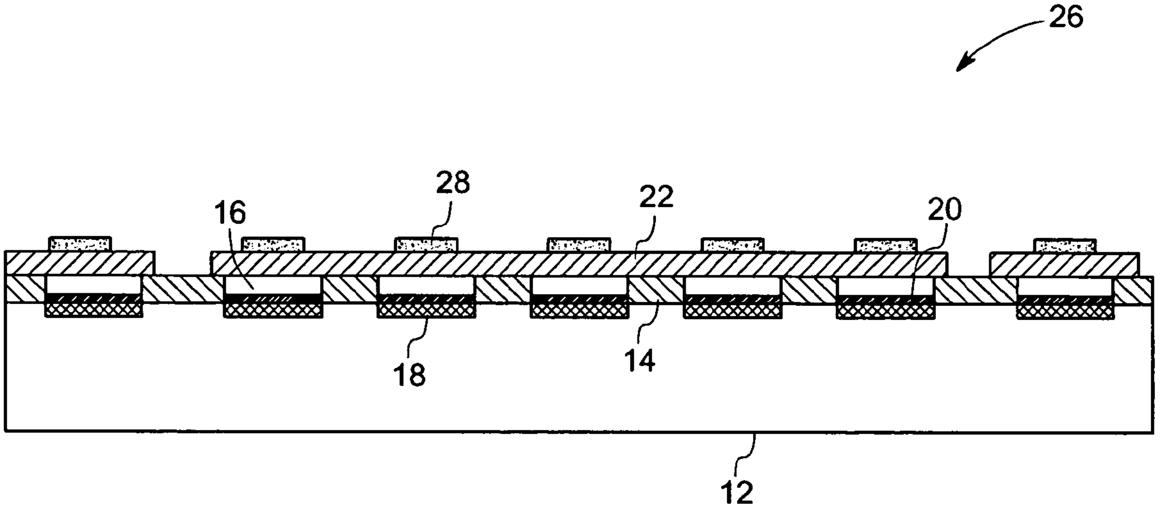
FIG. 3 is a cross-sectional side view illustrating an exemplary embodiment of a cMUT cell including an upper electrode and a substrate is locally doped and the doped region is configured to operate as a lower electrode, according to aspects of the present technique.

Turning out to FIG. 3, a side view of a cross-section of another exemplary embodiment 26 of a cMUT cell is illustrated. In this embodiment an upper electrode 28 may be patterned on the diaphragm 22, where the upper electrode 28 may be coupled to the diaphragm 22. The upper electrode 28 may be fabricated employing material, such as, but not limited to, a metal, a doped polysilicon or a doped epitaxial layer. In the illustrated embodiment, the diaphragm 22 may include an epitaxial layer of silicon. Further, as previously mentioned, the epitaxial layer of silicon may include a stress reducing material disposed therethrough. Also, the diaphragm 22 may include a p-type or an n-type material. Additionally, a level of doping in the diaphragm 22 may be low, and as a result the diaphragm 22 may be configured to exhibit high resistivity.

With continuing reference to FIG. 3, the substrate 12 may include a p-type or an n-type silicon wafer. In addition, a level of doping in the substrate 12 may be low, and thereby may result in the substrate 12 exhibiting high resistivity. Furthermore, the lower electrode 18 may be implanted or diffused in the substrate 12. In this embodiment, the lower electrode 18 may be highly doped which may result in the lower electrode 18 exhibiting low resistivity.

Figure 4:
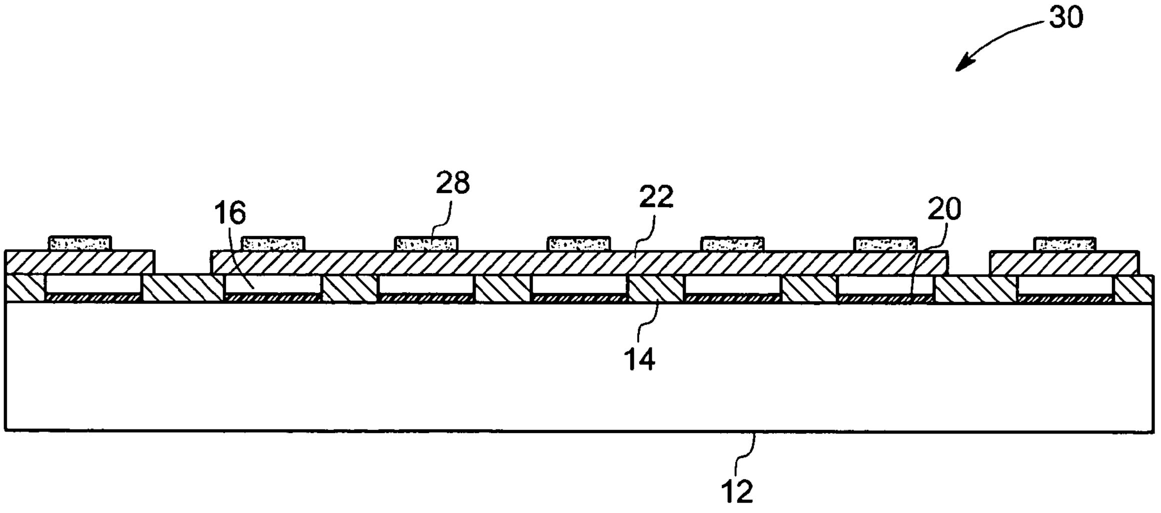
FIG. 4 is a cross-sectional side view illustrating an exemplary embodiment of the cMUT cell of FIG. 3, where the cMUT cell includes an upper electrode and a substrate is configured to operate as a lower electrode, according to aspects of the present technique.

FIG. 4 illustrates a side view of a cross-section of an alternate embodiment 30 of the cMUT cell 26 illustrated in FIG. 3. In the illustrated embodiment, the substrate 12 is configured for use as the lower electrode. The substrate 12 may be of p-type or n-type material. Further the substrate 12 may be highly doped and thus may be configured to exhibit low resistivity.

Figure 5:
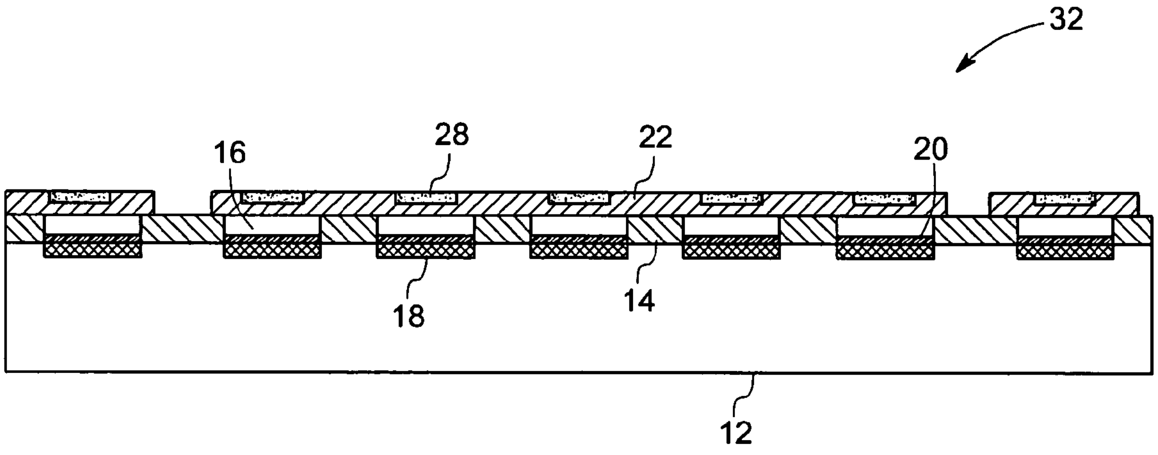
FIG. 5 is a cross-sectional side view illustrating an exemplary embodiment of a cMUT cell including a lower electrode and a locally doped upper electrode disposed in a diaphragm, according to aspects of the present technique.

FIG. 5 illustrates a side view of a cross-section of an exemplary embodiment 32 of a cMUT cell. In this embodiment, a material that may be configured for use as an upper electrode 28 may be implanted in the diaphragm 22. Alternatively, the upper electrode 28 may be formed by diffusing the material in the diaphragm 22. In this embodiment, the upper electrode 28 may include p-type or n-type material. Additionally, the implanted or diffused upper electrode 28 may be highly doped and thereby be configured to exhibit low resistivity. As previously mentioned, the diaphragm 22 may be of p-type or n-type material and may be configured to exhibit high resistivity.

Additionally, the substrate 12 may include a p-type or an n-type silicon wafer. In addition, a level of doping in the substrate 12 may be low, and thereby may result in the substrate 12 exhibiting high resistivity. Furthermore, the lower electrode 18 may be implanted or diffused in the substrate 12. In this embodiment, the lower electrode 18 may be highly doped which may result in the lower electrode 18 exhibiting low resistivity.

Figure 6:
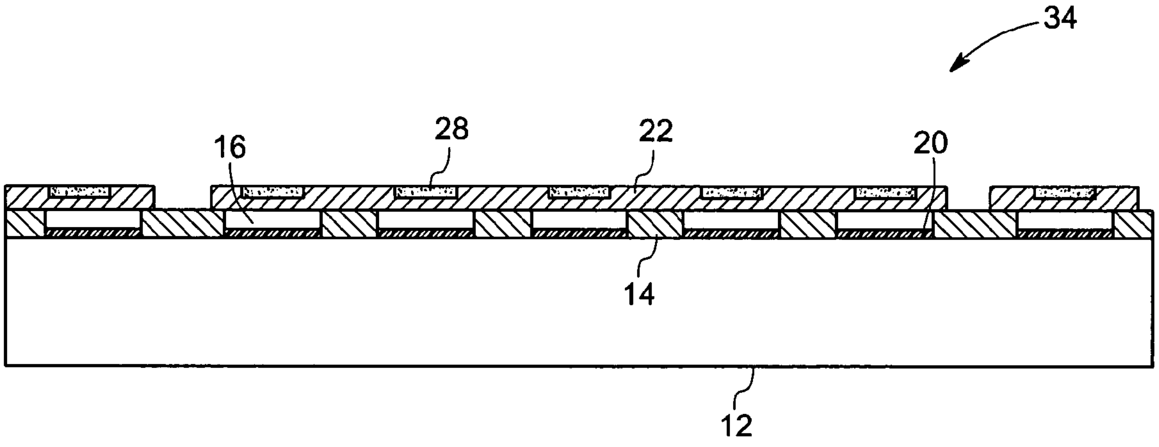
FIG. 6 is a cross-sectional side view illustrating an exemplary embodiment of the cMUT cell of FIG. 5, where the cMUT cell includes a locally doped upper electrode disposed in the diaphragm and a substrate is configured to operate as a lower electrode, according to aspects of the present technique.

FIG. 6 illustrates a side view of a cross-section of an alternate embodiment 34 of the cMUT cell 32 depicted in FIG. 5. In the illustrated embodiment, the substrate 12 is configured for use as the lower electrode. The substrate 12 may be of p-type or n-type material. Further the substrate 12 may be highly doped and consequently may be configured to exhibit low resistivity.

Figure 7:
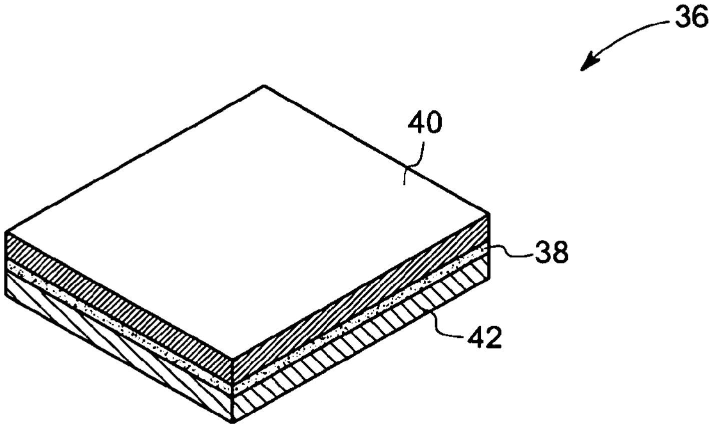
FIG. 7 is a perspective side view illustrating an exemplary embodiment of an upper electrode including an electrode layer disposed between a first epitaxial layer and a second epitaxial layer.

FIG. 7 illustrates an exemplary configuration 36 of the diaphragm 22 that may be employed as an upper electrode 28, according to further aspects of the present technique. In this exemplary configuration 36 an electrode layer 38 may be sandwiched between a first epitaxial layer 40 and a second epitaxial layer 42. This exemplary configuration 36 may then be configured for use as the upper electrode 28.

Figure 8:
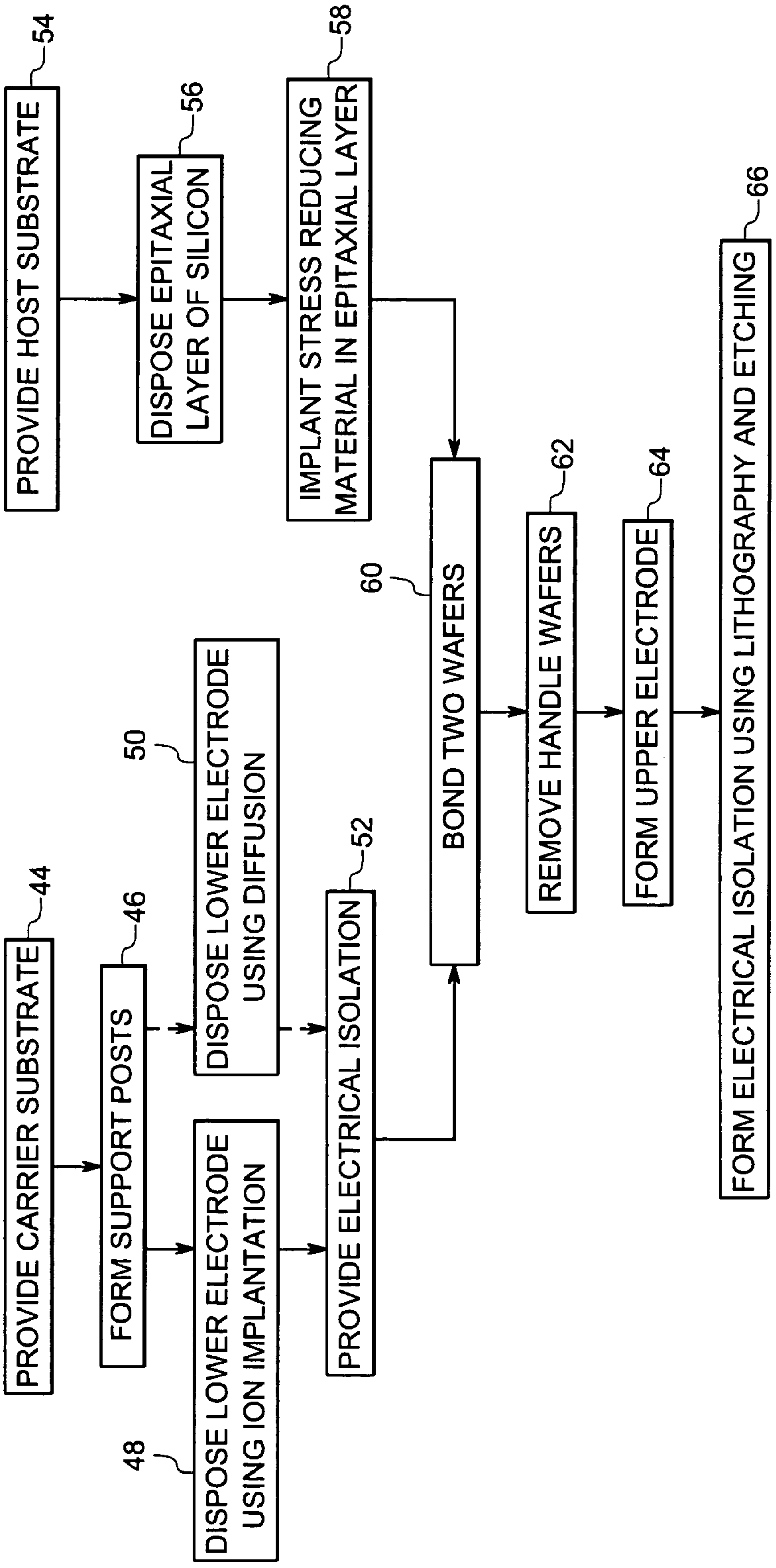
FIG. 8 depicts a flow chart illustrating a method for forming a cMUT cell.

According to further aspects of the present technique, a method for fabricating one embodiment of a composite structure of a cMUT cell is presented. As described here, the term composite structure is used to describe a structural member, such as the cMUT cell 10, fabricated by joining together distinct components. FIG. 8 depicts a process flow for fabricating the cMUT cell. The process may include fabricating a bottom portion that may include a lower electrode. In addition, the process may include fabricating a top portion that may include a diaphragm. Further, the top portion may also include an upper electrode.

As depicted in FIG. 8, step 44 depicts an initial step in the process of fabricating the bottom portion of a cMUT cell, such as the cMUT cell 10 illustrated in FIG. 1. Step 44 includes providing a carrier substrate 12 (see FIG. 1) or wafer having a topside and a bottom side. The carrier substrate 12 may include a p-type or an n-type silicon wafer. Further, a doping level of the substrate 12 may be configured to be low consequent to which the carrier substrate 12 may be configured to exhibit high resistivity.

At step 46, a first oxide layer may be formed on the topside of the carrier substrate 12 by means of an oxidation process that may be a dry oxidation process, a wet oxidation process, or a combination of the two. The thickness of the first oxide layer defines a gap between a lower electrode and an upper electrode of the cMUT cell 10.

Lithography and wet etching may be employed to etch away a section of the first oxide layer, thereby defining a plurality of support posts 14 (see FIG. 1) and a cavity 16 (see FIG. 1) that may be defined by the plurality of support posts 14. In one embodiment, the plurality of support posts 14 is disposed on the carrier substrate 12. A lithography step may be employed to form a suitable mask with openings defining the cavity 16. The first oxide layer may be etched using an isotropic etchant such as aqueous hydrogen fluoride (HF). Alternatively, the plurality of support posts 14 may be formed on a diaphragm of the cMUT cell 10 as will be described hereinafter.

Subsequently, at step 48, a lower electrode 18 (see FIG. 1) may be implanted in the carrier substrate 12. Methods such as ion implantation using a photoresist mask may be employed to implant the lower electrode 18 in the carrier substrate 12. Alternatively, as depicted by step 50, the lower electrode 18 may be diff-used in the carrier substrate 12. The lower electrode 18 may be diffused employing oxide as a mask. In step 52 an oxidation process, such as thermal oxidation, may be employed to dispose a dielectric floor 20 (see FIG. 1) that may aid in providing electrical insulation in the cavity 16.

The method for fabricating the cMUT cell further includes fabricating a top portion that may include the diaphragm 22 (see FIG. 1). According to an exemplary embodiment of the present technique, the diaphragm 22 may include an epitaxial layer. In accordance with aspects of the present technique, a host substrate having a topside and a bottom side is provided at step 54. The host substrate may include materials, such as silicon. Furthermore, the host substrate may include a p-type or an n-type material. Subsequently, at step 56 an epitaxial layer of silicon may be disposed on the topside of the host substrate. The thickness of the epitaxial layer may depend on a pre-determined thickness of the diaphragm 22. Alternatively, a polysilicon layer may be disposed on the topside of the host substrate via low-pressure chemical vapor deposition (LPCVD).

According to aspects of the present technique, the epitaxial layer and the host substrate are oppositely doped. For instance, if the host substrate includes a p-type material, then the epitaxial layer may be configured to include an n-type material. On the other hand, if the host substrate includes an n-type material, then the epitaxial layer may be configured to include a p-type material. Additionally, a level of doping in the epitaxial layer is different than a level of doping in the host substrate. For example, if the level of doping in the host substrate is low, then the epitaxial layer may be highly doped. Alternatively, if the host substrate is highly doped, then the level of doping in the epitaxial layer may be low. For example, the doping level of the host substrate is in a range from about $1e^{13}$ per $cm^3$ to about $1e^{20}$ per $cm^3$. Also, the doping level of the epitaxial layer is in a range from about $1e^{13}$ per $cm^3$ to about $1e^{20}$ per $cm^3$.

Furthermore, in step 58, a stress reducing material, such as, but not limited to, germanium, may be disposed in the epitaxial layer, in accordance with aspects of the present technique. As previously mentioned, the stress reducing material may be configured to substantially lower the tensile and/or compressive stress in the epitaxial layer. In step 58, the stress reducing material may be disposed in the epitaxial layer via ion implantation or in-situ doping.

In accordance with one embodiment of the present technique, the plurality of support posts 14 may be disposed on the epitaxial layer. In this embodiment, an oxide layer may be disposed on the epitaxial layer by means of an oxidation process that may be a dry oxidation process, a wet oxidation process, or a combination of the two. The oxide layer defines a gap between the lower electrode 18 and the upper electrode 28. Lithography and wet etching may be employed to etch away a section of the oxide layer, thereby defining a plurality of support posts 14 (see FIG. 1) and a cavity 16 (see FIG. 1) that may be defined by the support posts 14. A lithography step may be employed to form a suitable mask with openings defining the cavity 16 and the first oxide layer may be etched using an isotropic etchant such as aqueous hydrogen fluoride (HF).

After fabrication of each of the top portion and the bottom portion, the composite structure of the cMUT cell 10 may be formed by disposing the top portion on the bottom portion such that the epitaxial layer faces the carrier substrate 12, as depicted in step 60. In other words, the top and bottom portions are positioned such that the cavity 16 within the bottom portion is substantially covered by the epitaxial layer disposed on the top portion, thereby forming a chamber between the two substrates. Subsequently, the two substrates, that is the carrier substrate and the host substrate, may be bonded by fusion wafer bonding, for example.

The wafer bonding step may be followed by removal of a handle wafer, such as the host substrate in step 62. According to aspects of the present technique, in step 62, the host substrate may be thinned down to form the diaphragm 22 of a pre-determined thickness by employing electrochemical etching with an etch stop, such as a reverse-biased p-n junction. Also, as will be appreciated by one skilled in the art, the thickness of the epitaxial layer is based upon a desired predetermined thickness. As previously mentioned, there exists a differential in the doping levels between the host substrate and the epitaxial layer. This differential in doping levels may be employed to advantageously facilitate control of the thickness of the epitaxial layer. Accordingly, this differential in doping levels may be employed to stop the etching of the epitaxial layer to control the thickness of the diaphragm 22. Alternatively, timed etching may be employed for thickness control.

As will be appreciated by one skilled in the art, in step 62, the host substrate may be removed by employing mechanical polishing or grinding followed by wet etching with chemicals such as, but not limited to, tetramethyl ammonium hydroxide (TMAH), potassium hydroxide (KOH) or Ethylene Diamine Pyrocatechol (EDP), whereby only the epitaxial layer which forms the diaphragm 22 (see FIG. 1) over the cavity 16 remains.

Subsequently, at step 64, an upper electrode may be defined. In one embodiment of the present technique, the diaphragm 22 may be configured for use as the upper electrode 28. In this embodiment, the diaphragm 22 may be highly doped and consequently the diaphragm may be configured to exhibit low resistivity.

According to further aspects of the present technique, the diaphragm 22 may be formed by growing a first epitaxial layer on the host substrate. An electrode layer may be disposed on the first epitaxial layer. Following the disposing of the electrode layer, a second epitaxial layer may be disposed on the electrode layer such that it substantially covers the electrode layer. This exemplary configuration, illustrated in FIG. 7, where the electrode layer is sandwiched between two epitaxial layers may then be configured for use as the upper electrode 28.

Alternatively, in another embodiment, a material may be disposed on the diaphragm 22, where the material may be configured for use as the upper electrode 28. For example, a thin layer of metal may be disposed on the diaphragm 22 to make up the upper electrode 28. The upper electrode 28 may be formed employing materials, such as, but not limited to, a metal, a doped polysilicon, or a doped epitaxial layer.

The formation of the upper electrode 28 at step 64 may be followed by a photolithography and dry etch sequence to pattern the upper electrode 28 such that a capacitive sensor is generated. Subsequently, another photolithography and dry etch sequence may be performed at step 66 to remove the epitaxial layer and oxide layer around the periphery of the cMUT cell 10. This may advantageously facilitate electrical isolation of individual cMUT cells from neighboring cMUT cells that may be arranged in an array. Additionally, the photolithography and dry etch process may aid in establishing electrical contact with the carrier substrate 12 that may include the lower electrode 18.

The various embodiments of the cMUT cell and the methods of fabricating the cMUT cell described hereinabove enable cost-effective fabrication of cMUT cells. Further, employing the method of fabrication described hereinabove, greater control of the thickness of the diaphragm 22 may be achieved. Additionally, local doping of the lower electrodes may advantageously facilitate reduction of parasitic capacitances thereby leading to higher sensitivity. These cMUT cells may find application in various fields such as medical imaging, non-destructive evaluation, wireless communications, security applications and other applications.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A capacitive micromachined ultrasound transducer cell comprising:

a substrate having a lower electrode formed therein;

a diaphragm disposed adjacent to the lower electrode such that a gap having a first gap width is formed between the diaphragm and the lower electrode, wherein the diaphragm consists of one of a first epitaxial layer or a first polysilicon layer;

a dielectric floor disposed inside the gap; and a stress reducing material disposed in one of the first epitaxial layer or the first polysilicon layer.

2. The capacitive micromachined ultrasound transducer cell of claim 1, wherein the stress reducing material comprises germanium.

3. The capacitive micromachined ultrasound transducer cell of claim 1, further comprising an upper electrode coupled to the diaphragm.

4. The capacitive micromachined ultrasound transducer cell of claim 1, wherein the diaphragm comprises the upper electrode.

5. The capacitive micromachined ultrasound transducer cell of claim 1, further comprising a material disposed on the diaphragm, wherein the material is configured for use as an upper electrode.

6. The capacitive micromachined ultrasound transducer cell of claim 5, wherein the material comprises one of a metal, a doped polysilicon, a doped epitaxial layer or any electrical conductive semiconductor material.

7. The capacitive micromachined ultrasound transducer cell of claim 1, further comprising a material disposed between the diaphragm and a second epitaxial layer in a configuration where the diaphragm and the second epitaxial layer are positioned opposite one another, and wherein the configuration is configured for use as the upper electrode.

8. A capacitive micromachined ultrasound transducer cell comprising:

a substrate;

a lower electrode, wherein the lower electrode is either implanted or diffused in the substrate;

a diaphragm disposed on a first substrate, wherein one of the diaphragm or the first substrate is oppositely doped, and wherein a level of doping in the diaphragm is different than a level of doping in the first substrate, and wherein the diaphragm is disposed on a plurality of support posts to form a composite structure having a gap between the lower electrode and the diaphragm; and a dielectric floor disposed inside the gap.

9. The capacitive micromachined ultrasound transducer cell of claim 8, further comprising a stress reducing material disposed in the diaphragm.

10. The capacitive micromachined ultrasound transducer cell of claim 9, wherein the stress reducing material comprises germanium.

11. The capacitive micromachined ultrasound transducer cell of claim 8, wherein the diaphragm comprises either a first epitaxial layer or a first polysilicon layer.

12. The capacitive micromachined ultrasound transducer cell of claim 8, wherein the diaphragm comprises an n-type material and the first substrate comprises a p-type material.

13. The capacitive micromachined ultrasound transducer cell of claim 8, wherein the doping level of the diaphragm is high and the doping level of the first substrate is low.

14. The capacitive micromachined ultrasound transducer cell of claim 8, wherein the doping level of the diaphragm is low and the doping level of the first substrate is high.

15. The capacitive micromachined ultrasound transducer cell of claim 8, wherein the doping level of the diaphragm is in a range from about $1e^{13}$ per $cm^3$ to about $1e^{20}$ per $cm^3$.

16. The capacitive micromachined ultrasound transducer cell of claim 8, wherein the doping level of the substrate is in a range from about $1e^{13}$ per $cm^3$ to about $1e^{20}$ per $cm^3$.

17. The capacitive micromachined ultrasound transducer cell of claim 8, wherein the diaphragm comprises a single crystal epitaxial layer.

18. The capacitive micromachined ultrasound transducer cell of claim 8, wherein the plurality of support posts are perpendicular to the substrate.

19. A capacitive micromachined ultrasound transducer cell comprising:

a substrate;

a cavity formed in a topside of the substrate, wherein the cavity is defined by a plurality of support posts;

a lower electrode exposed at a bottom of the cavity and formed within the substrate;

a diaphragm disposed on the plurality of support posts to form a composite structure having a gap between the lower electrode and the diaphragm;

a dielectric floor disposed inside the gap; and a stress reducing material disposed in the diaphragm.

20. The capacitive micromachined ultrasound transducer cell of claim 19, wherein the diaphragm comprises one of a first epitaxial layer or a first polysilicon layer.

21. The capacitive micromachined ultrasound transducer cell of claim 19, wherein the diaphragm and the substrate are oppositely doped, and wherein a doping level in the diaphragm is different than a doping level in the substrate.

* * * * *